United States Patent [19]

Okumura et al.

[11] Patent Number: 5,367,551

[45] Date of Patent: Nov. 22, 1994

[54] INTEGRATED CIRCUIT CONTAINING SCAN CIRCUIT

[75] Inventors: Kenzo Okumura, Nara; Satoru Matumoto, Nara, both of Japan

[73] Assignee: Sharp Kabushiki Kaisha, Osaka, Japan

[21] Appl. No.: 908,175

[22] Filed: Jul. 2, 1992

[30] Foreign Application Priority Data

Jul. 4, 1991 [JP] Japan .................. 3-164481

[51] Int. Cl.$^5$ .............................................. G11C 7/00
[52] U.S. Cl. ........................................ 377/80; 377/77; 377/81; 377/106
[58] Field of Search ............... 377/67, 77, 78, 80, 377/104, 106, 81, 64, 70, 75

[56] References Cited

U.S. PATENT DOCUMENTS

| | | | |
|---|---|---|---|
| 3,496,475 | 2/1970 | Arnold | 377/78 |
| 3,636,376 | 1/1972 | Hoffmann | 377/78 |
| 4,509,183 | 4/1985 | Wright | 377/104 |
| 5,198,999 | 3/1993 | Abe et al. | 377/78 |

FOREIGN PATENT DOCUMENTS 62-278474 12/1987 Japan .

*Primary Examiner*—Timothy P. Callahan
*Assistant Examiner*—My-Trang Nu Ton

[57] ABSTRACT

An integrated circuit is provided for reducing scale of flip-flops which can be connected in the form of a shift register by the switching operation, in order to facilitate the test during the manufacture of an integrated circuit (gate array). One selector for switching a clock signal for the flip-flops to either of a system clock signal and a scan clock signal is provided not for each of the sequential circuits, but for each of the clock systems for these sequential circuits. In a case of a gate array, for example, this allows a reduction of three gates for each flip-flop to be realized.

23 Claims, 7 Drawing Sheets

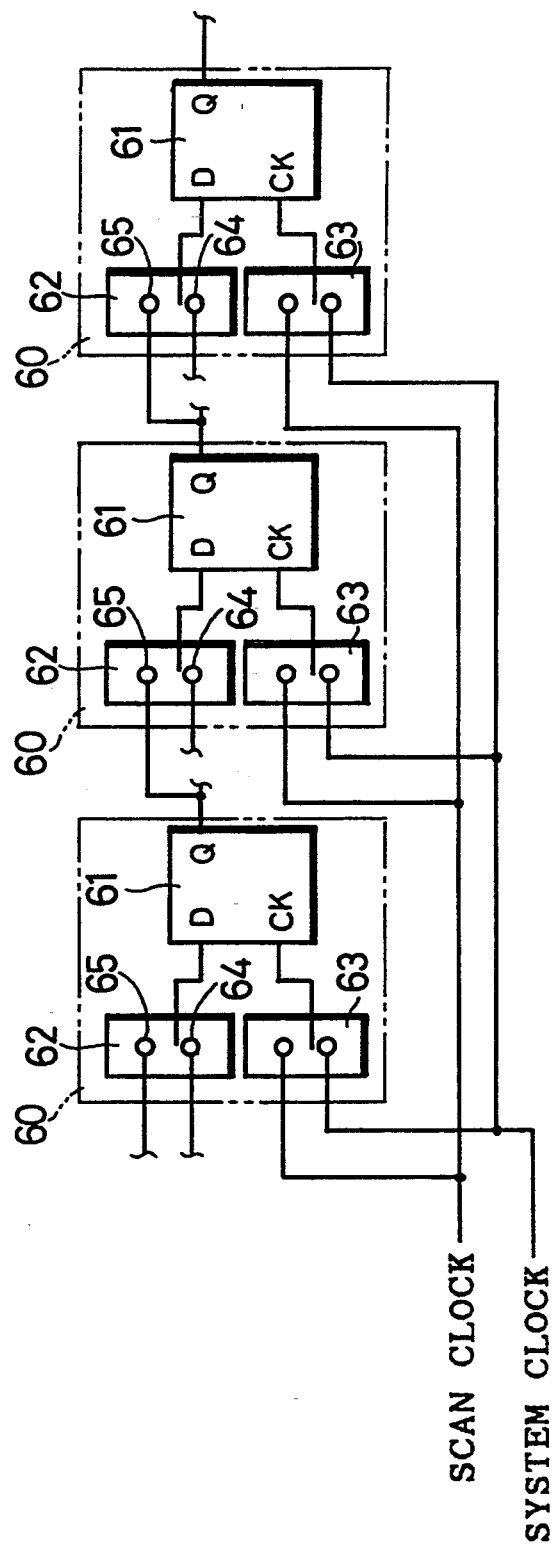
Fig.1 Prior Art

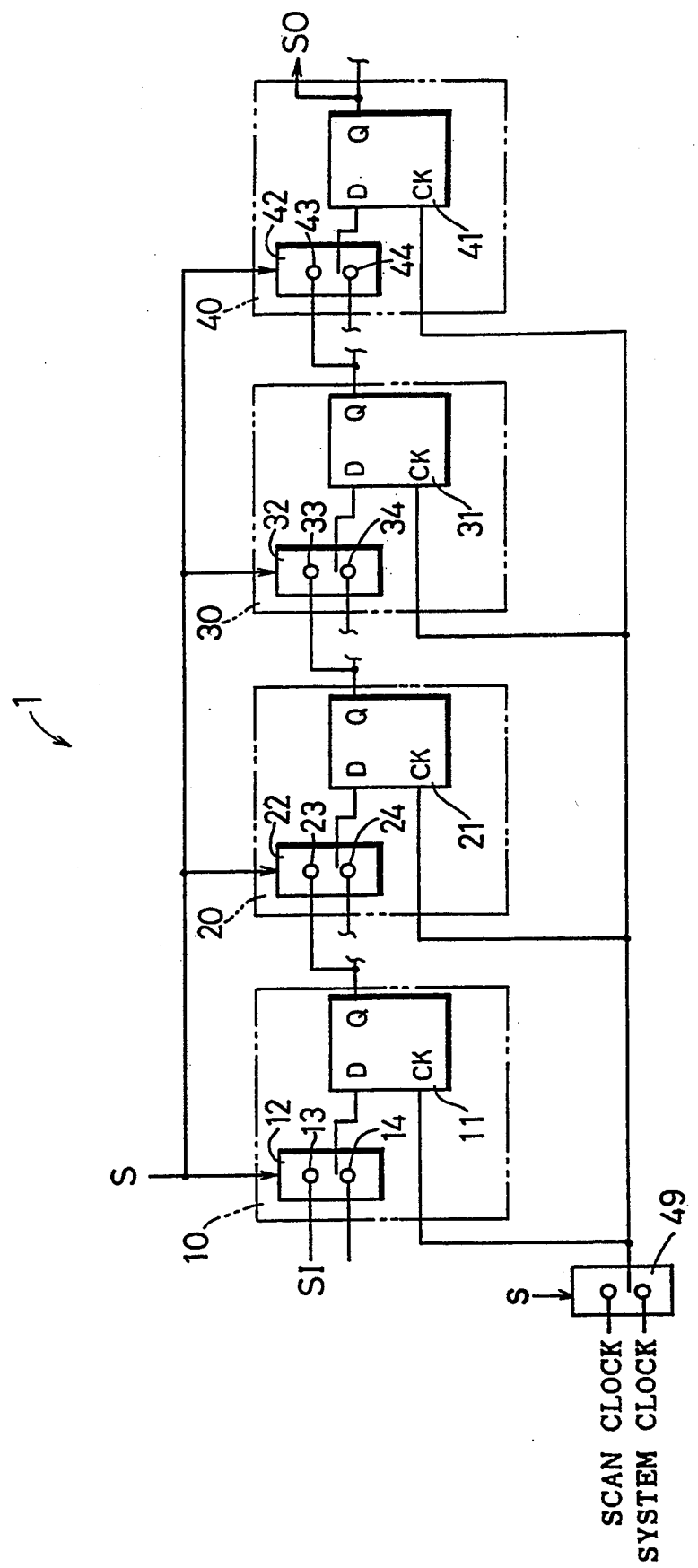
Fig. 2

PRIOR ART
Fig. 3(A)
PRIOR ART
Fig. 3(B)
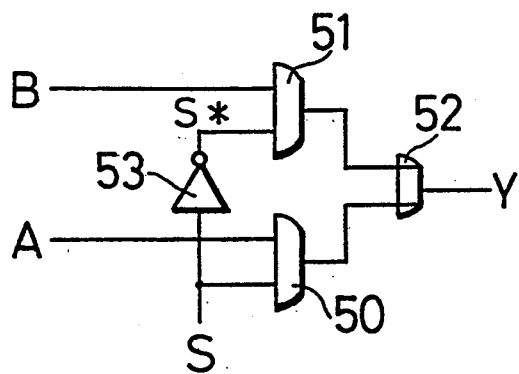
| S | Y |
|---|---|
| 1 | A |
| 0 | B |

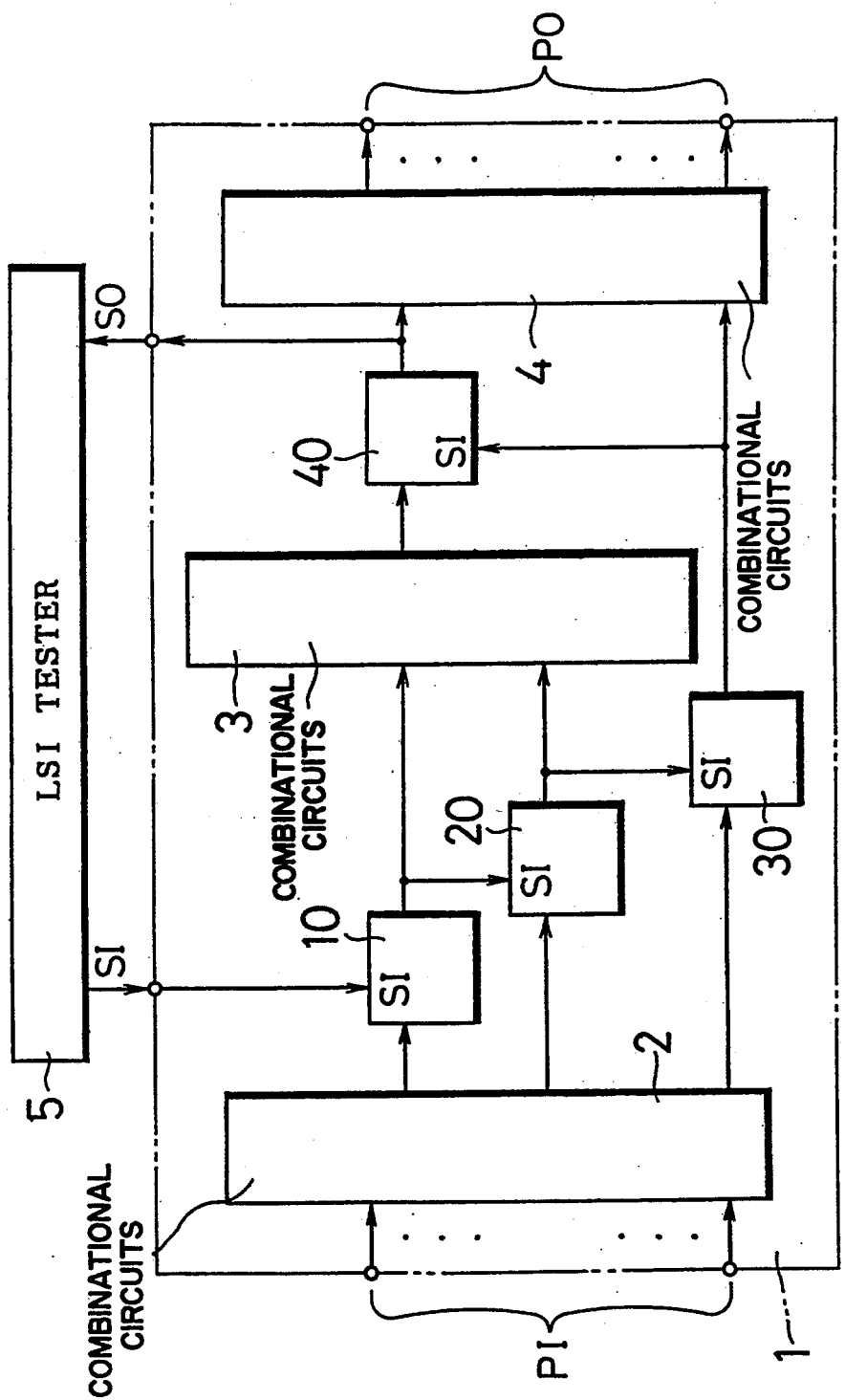
Fig. 4

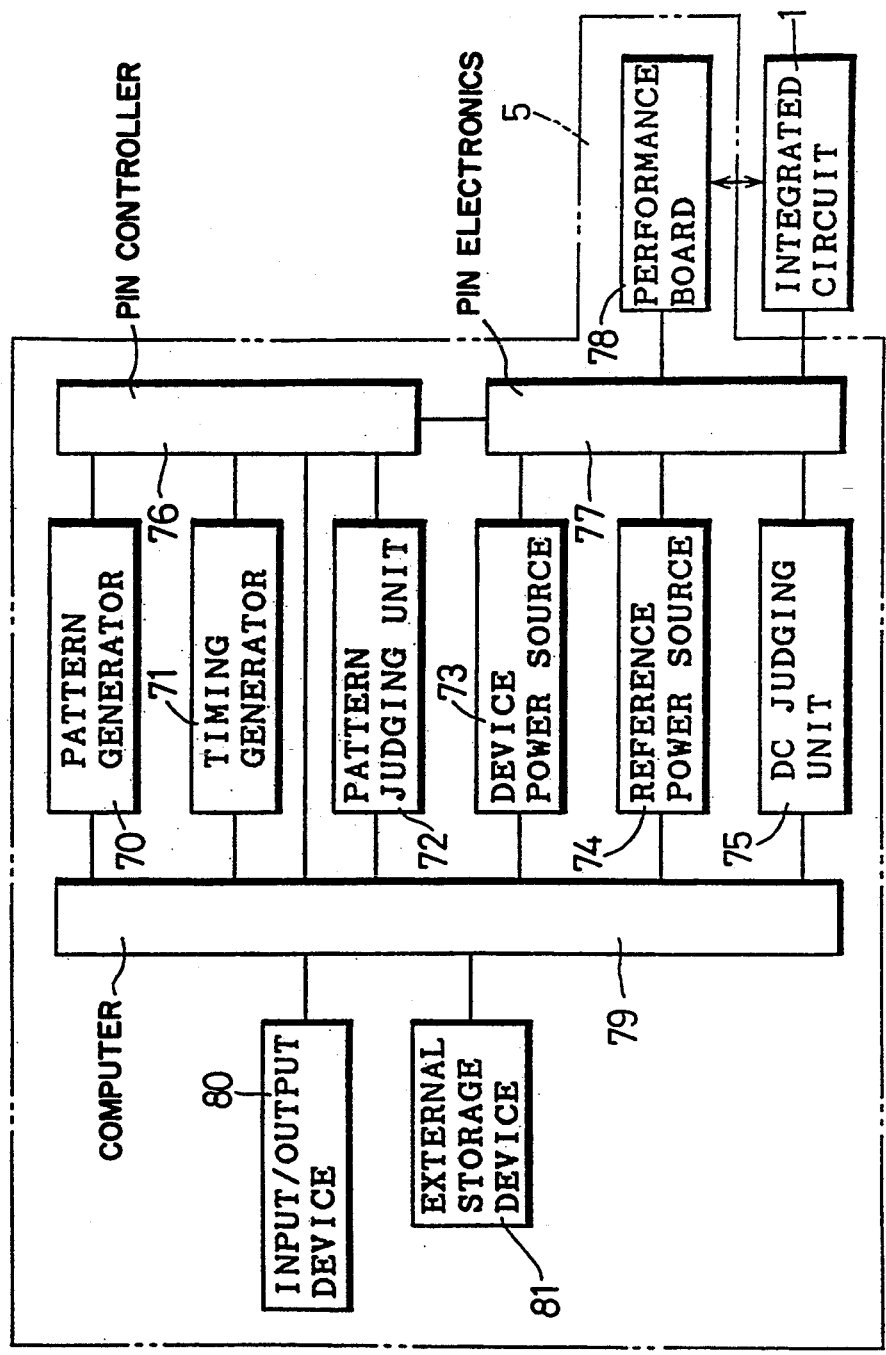
Fig. 5

Fig. 6

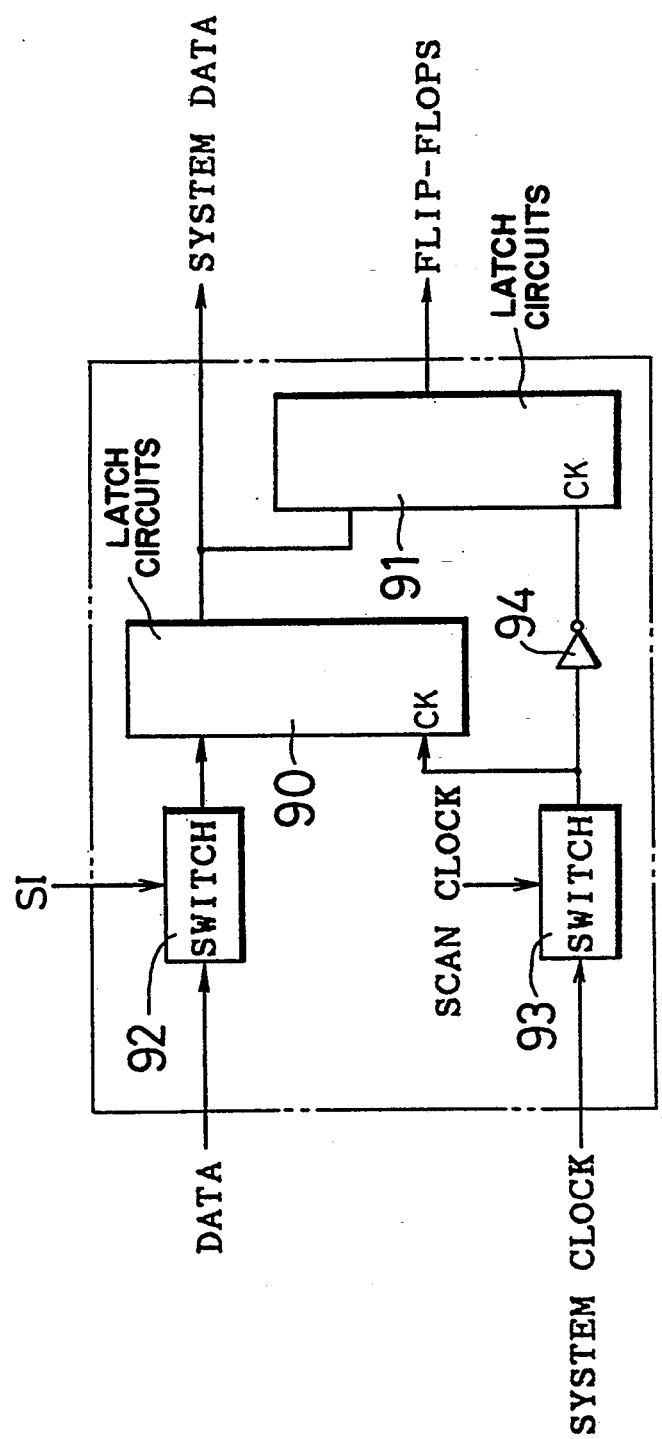
Fig. 7

INTEGRATED CIRCUIT CONTAINING SCAN CIRCUIT

BACKGROUND OF THE INVENTION

1. Field of the Invention

This invention relates to an integrated circuit containing a scan circuit in which sequential circuits such as flip-flops are connected in the form of a shift register in order to facilitate the test during the manufacture.

2. Description of the Related Art

In the manufacture of an integrated circuit using a gate array, etc., it is required to conduct a test for determining whether or not a manufactured chip normally functions. However, the test pattern (inspection series) for an integrated circuit including sequential circuits (elements having memory functions) such as flip-flops and latches is complex and huge. Therefore, a scan pass method has been practically used in which the internal state is set and read out by switching sequential circuits to connect them in the form of a shift register and applying a scan clock signal only to these circuits. According to this method, it is easy to prepare a test pattern.

FIG. 1 is a diagram showing one portion of an integrated circuit using the scan pass method. In the figure, three flip-flops are shown in which the memory state is set and read out by a scan clock signal. Each of the flip-flops 60 includes a flip-flop main body 61 which is a D-type flip-flop, a data selector 62, and a clock selector 63. As is well known, a D-type flip-flop is a flip-flop which outputs from the Q output terminal the state of the data input terminal D at the time when a clock signal (rising edge) is input. The data selector 62 is a switch circuit by which the connection of the D terminal of the flip-flop main body 61 is switched to the data input terminal 64 in the primary operation (normal operation) of the integrated circuit, or to the scan-in terminal 65 for receiving the input from a flip-flop which is connected in the preceding stage in the read out operation (scan operation) wherein the flip-flops are connected during the test process in the form of a shift register to read out the memory contents. The clock selector 63 is a switch circuit which selects one of the system clock signal and the scan clock signal and supplies the selected clock signal to the clock (CK) terminal of the flip-flop main body 61. The switch operations of the data selector 62 and clock selector 63 are controlled by the same select signal from an LSI tester.

The system clock signal is a clock signal used in the normal operation, and applied to all circuits of the integrated circuit. Depending upon the configuration of the integrated circuit, there may be a case that the same clock signal is not applied to all circuits of the integrated circuit. Today, with the increased scale of integrated circuits, it has been popular that a plurality of system clock signals exit in an integrated circuit of one chip. On the other hand, the scan clock signal is a clock signal which is applied only to sequential circuits from which data must be read out during the test process as illustrated, and the same scan clock signal is applied to all circuits which are connected in the form of a shift register.

In a conventional integrated circuit such as shown in FIG. 1, all of the flip-flops which are to be connected in the form of a shift register are provided with the data selector 62 and the clock selector 63. These selectors may have a configuration such as shown in FIG. 3(A). When this configuration is realized by basic cells of a gate array, it is required to use three gates. Although only three flip-flops are shown in FIG. 1, the number of flip-flops which are subjected to the scan path method (or connected in the form of a shift register) in an actual integrated circuit amounts from several tens to several hundreds. When the selectors are provided for all of these flip-flops, a very large number of gates are required for performing the selection of clock signals, thereby developing a defect that the circuit configuration becomes large.

SUMMARY OF THE INVENTION

It is an object of the invention to provide an integrated circuit containing a scan circuit therein in which the aforesaid problem can be solved by providing each system with a switch circuit for a scan clock signal and a system clock signal.

An embodiment of the invention is directed to an integrated circuit comprising combinational circuits and sequential circuits, and containing a scan circuit for connecting the sequential circuits in the form of a shift register and applying a scan clock signal only to the sequential circuits connected in the form of a shift register to set or read out the internal memory state of each of the sequential circuits, among clock signal systems of the integrated circuit, only the clock signal systems for the sequential circuits connected in the form of a shift register are combined into one or more systems, and one switch circuit for switching a signal to be applied to the system to either of a system clock signal and the scan clock signal is provided for each of the systems.

According to an embodiment the invention, the clock signal systems for the sequential circuits which are connected for the scan operation of the test process in the form of a shift register are combined into one or more systems, and one switch circuit is provided for each of the systems. The switch circuit is a circuit for applying one of the system clock signal and the scan clock signal to the system. Since the clock signal is supplied to each of the sequential circuits through the switch circuit, it is not required for each of the sequential circuits to contain a switch circuit. When the clock signal system is divided into a plurality of systems, sequential circuits to which different system clock signals are supplied may be combined into one system.

As described above, according to an embodiment the invention, since one switch circuit which switches the clock signal supplied to the sequential circuits to one of the system clock signal and the scan clock signal is provided for each of the systems, it is possible to reduce the required number of circuits and to make the circuit scale small.

BRIEF DESCRIPTION OF THE DRAWINGS

Other and further objects, features, and advantages of the invention will be more explicit from the following detailed description taken with reference to the drawings wherein:

FIG. 1 is a block diagram illustrating the configuration of one portion of an integrated circuit which performs a conventional scan operation;

FIG. 2 is a block diagram illustrating the configuration of one portion of an integrated circuit which is an embodiment of the invention;

FIGS. 3(A) and 3(B) is a diagram illustrating the configuration and operation respectively of a conventional selector;

FIG. 4 is a circuit diagram schematically illustrating the configuration of the whole of an integrated circuit;

FIG. 5 is a block diagram illustrating the configuration of an LSI tester;

FIG. 6 is a timing chart illustrating the test operation of the integrated circuit; and FIG. 7 is a circuit diagram illustrating another embodiment.

DESCRIPTION OF THE PREFERRED EMBODIMENTS

Now referring to the drawing, preferred embodiments of the invention are described below.

FIG. 2 is a block diagram illustrating one portion of an integrated circuit 1 which is an embodiment of the invention. The figure shows four flip-flops 10, 20, 30 and 40. When a select signal S is changed to the state of the scan operation (for example, high level), these flip-flops are connected in the form of a shift register. The flip-flops include flip-flop main bodies 11, 21, 31 and 41 and data selectors 12, 22, 32, 42, respectively. Each of the data selectors is connected to the data terminal (D terminal) of the respective flip-flop main body, and changes from the connection state for the normal operation to that for the scan operation or vice versa in accordance with the select signal S.

For the scan operation in addition to the normal operation, the output terminal (Q terminal) of the flip-flop main body 11 is connected to the scan-in terminal 23 of the data selector 22, and similarly the output terminal (Q terminal) of the flip-flop main body 21 is connected to the scan-in terminal 33 of the data selector 32. When the select signal S is a high level, therefore, the flip-flops 10, 20, 30 and 40 are connected in this sequence in the form of a shift register. A clock signal from a clock selector 49 is input to the clock terminal (CK terminal) of each of the flip-flop main bodies. To the clock selector 49, input are a system clock signal and a scan clock signal. The clock selector 49 is switched by the same select signal S as that for the data selectors 12, 22, 32 and 42. That is, when the select signal is a signal indicative of the normal operation (low level), the data selectors 12, 22, 32 and 42 are in the circuit connection for the normal operation, and the clock selector 49 selects the system clock signal. In contrast, when the select signal S is a signal indicative of the scan operation (high level), the data selectors 12, 22, 32 and 42 are connected to the respective flip-flop of the preceding stage, and the clock selector 49 selects the scan clock signal. This eliminates the necessity of incorporating a clock selector in each of the flip-flops.

FIG. 3(A) is a diagram illustrating the configuration of a conventional selector. This circuit is applied to the clock selector 49, the data selectors 12, 22, 32 and 42, etc. Signals A and B, which are to be subjected to the selection, are input to two-input AND circuits 50 and 51 which function as gates, respectively. The outputs of these AND circuits 50 and 51 are input to a two-input OR circuit 52. The output of the OR circuit 52 constitutes an output signal Y. To the other input terminals of the AND circuits 50 and 51, input are the select signal S and a signal S* which has been inverted by an inverter 53. Namely, the signals A and S are input to the AND circuit 50, and the signals B and S* are input to the AND circuit 51. In this configuration, when the select signal S is 1, the signal A is output as the output signal Y, and, when the select signal S is 0, the signal B is output as the output signal Y as illustrated in FIG. 3(B). When such a select circuit is composed of a gate array, three gates (basic cells) are generally required. Therefore, the provision of one clock selector for each system can reduce the number of gates by (the number of flip-flops included in the system - 1) 3 times as compared with a case in which a clock selector is provided for each flip-flop.

FIG. 4 is a circuit diagram schematically illustrating the configuration of the whole of the integrated circuit 1. The integrated circuit 1 includes combinational circuits 2, 3 and 4 and flip-flops 10, 20, 30 and 40 and receives a signal P1 and outputs a signal PO. In the normal operation, the flip-flops 10, 20, 30 and 40 function as latch circuits. The flip-flops 10 and 20 latch the output of the combinational circuit 2 and supply this output to the combinational circuit 3. The flip-flop 30 latches the output of the combinational circuit 2 and supplies this output to the combinational circuit 4. The flip-flop 40 latches the output of the combinational circuit 3 and supplies this output to the combinational circuit 4. In the test operation performed by an LSI tester 5, these flip-flops are connected in the form of a shift register as shown in FIG. 2. A combinational circuit is a circuit other than a storage device and consists only of an INV, AND, OR, NAND or NOR circuit or the like.

FIG. 5 is a block diagram illustrating the configuration of the LSI tester 5. A pattern generator 70 generates a test pattern (test signal) for testing the operation of the integrated circuit 1. A timing generator 71 consists of a polyphase programmable clock generator and sets the conditions of the test timing. A pattern judging unit 72 judges whether or not an output pattern (output signal) from the integrated circuit 1 meets the expectation. A device power source 73 supplies a voltage to a power source terminal of the integrated circuit 1. A reference power source 74 supplies a reference voltage to pin electronics 77. A DC judging unit 75 applies a voltage and current to the integrated circuit 1 and performs a measurement. A pin controller 76 combines the signal from the pattern generator 70 and the clock signal from the timing generator 71 to generate a waveform to be applied to the integrated circuit 1. The pin electronics 77 consists of a driver which applies a signal to the integrated circuit 1, and a comparator which detects an output from the integrated circuit 1. A performance board 78 constitutes additional circuits required for the measurement.

A computer 79 controls the entirety of the LSI tester 5. An input/output device 80 includes a keyboard, printer, display, etc. and performs input operations such as the instructions of the start of a test and the setting of the kind of the test and also operations of displaying and printing test results. An external storage device 81 includes a magnetic storage medium such as a magnetic disc or a magnetic tape and stores therein test results, etc. for each integrated circuit.

FIG. 6 is a timing chart illustrating the test operation of the integrated circuit 1. When a select signal S is set to High, the flip-flops 10, 20, 30 and 40 are connected in the form of a shift register. While applying a scan clock signal to each of the flip-flops, serial data SO1–SO4 are sequentially input as a test signal S1, thereby setting the values of the flip-flops. The select signal S is returned to Low so that the flip-flops are disconnected from each other, and then the supply of one clock of the system clock signal causes the response signal from the combinational circuits to be latched. Thereafter, the select signal S is set again to High and the flip-flops 10, 20, 30 and 40 are connected in the form of a shift register. While supplying the scan clock signal to each of the flip-flops, the latched values are shifted in sequence to be output as a result signal SO to the LSI tester 5. The LSI tester 5 judges on the basis of the result signal SO whether or not the integrated circuit has passed the test.

FIG. 7 is a circuit diagram illustrating another present embodiment. The embodiment having flip-flops as sequential circuits has been described with reference to FIG. 2. In contrast, the embodiment shown in FIG. 7 has the configuration in which the scan path method is performed using latch circuits. In the present embodiment, the scan circuit consists of latch circuits 90 and 91, switches 92 and 93 and an inverter circuit 94. The switch 92 selects data in the normal operation and the test signal SI in the test operation, to output the selected one to the latch circuit 90. The switch 93 selects the system clock signal in the normal operation and the scan clock signal in the test operation, to output the selected one to the clock (CK) terminals of the latch circuits 90 and 91. The latch circuit 91 is also supplied with an inverted signal of the output of the switch 93; which is obtained through the inverter circuit 94, namely a clock signal which is shifted by a half cycle. The output of the latch circuit 90 is output as system data in the normal operation and supplied to the latch circuit 91 in the test operation. The output of the latch circuit 91 is supplied to another sequential circuit such as a flip-flop in the next stage.

In this way, a scan circuit in which flip-flops and latch circuits mixedly exist may be used. In the case of using latch circuits, however, the area required for forming the integrated circuit increases because their configuration must be converted to the flip-flop type.

In FIG. 2, one system controlled by one system clock signal is shown. When flip-flops controlled by a plurality of system clock signals are to be scanned, the system clock signals may respectively constitute different systems, and the clock selector 49 may be provided for each of these systems. In an integrated circuit which operates on the basis of a sole system clock signal, a circuit for shutting off the clock signal from combinational circuits which are to be disconnected in the scan operation may be provided instead of the clock selector 49, and, when the system clock signal is applied after this circuit is operated to conduct the shutoff, the scan operation may be performed using the system clock signal.

The invention may be embodied in other specific forms without departing from the spirit or essential characteristics thereof. The present embodiments are therefore to be considered in all respects as illustrative and not restrictive, the scope of the invention being indicated by the appended claims rather than by foregoing description and all changes which come within the meaning and the range of equivalency of the claims are therefore intended to be embraced therein.

What is claimed is:

1. An integrated circuit comprising:
    a plurality of combinational circuits;
    a plurality of sequential circuits, each connected to at least one combinational circuit, and selectively operable in a shift register state or in a normal non shift register state,
    interconnecting at least two of the plurality of sequential circuits for operating in the form of a shift register upon receipt of an external signal of a first state applied thereto and the plurality of sequential circuits operating normally in non shift register state upon receipt of an external signal of a second state applied thereto; and
    a single clock switch circuit, connected to each of the sequential circuits, for applying a system clock signal to each of the plurality of sequential circuits upon receipt of the external signal of the second state and for applying a scan clock signal to each of the plurality of sequential circuitry connected in the form of a shift register upon receipt of the external signal of the first state.

2. The integrated circuit of claim 1, wherein the scan clock signal is applied only to the sequential circuits connected in the form of the shift register to set or read out an internal memory state of each of the sequential circuits.

3. The integrated circuit of claim 1, further comprising a plurality of clock signal systems, at least one clock signal system including a plurality of combinational circuits, a plurality of sequential circuits and a single clock switch circuit.

4. The integrated circuit of claim 3, wherein only the clock signal systems including sequential circuits connected in the form of the shift register are combined into one or more common clock signal systems.

5. An integrated circuit for a one clock signal system comprising:
    a plurality of combinational circuits;
    a plurality of sequential circuits, each connected to at least one combinational circuit, the plurality of sequential circuits including,
    a plurality of data select circuits for connecting at least two of the plurality of sequential circuits in the form of a shift register, each of said data select circuits corresponding to one of said sequential circuits; and
    a single clock switch circuit, connected to each of the sequential circuits, for selecting between a system clock signal and a scan clock signal, and said scan clock signal being applied to said at least two of the plurality of sequential circuits only when said plurality of data select circuits connect said at least two of the plurality of sequential circuits in the form of a shift register.

6. An integrated circuit in accordance with claim 5, wherein said plurality of sequential circuits comprise a plurality of flip-flops.

7. An integrated circuit in accordance with claim 5, wherein each of said plurality of combinational circuits comprise at least one of an inverter, an AND, an OR, a NAND, and a NOR circuit.

8. An integrated circuit in accordance with claim 5, wherein a select signal controls each of said data select circuits and said single clock switch circuit.

9. The integrated circuit of claim 8, wherein a select signal of a first state, applied to each of the data select circuits, connects at least two of the plurality of sequential circuits in the form of a shift register and a select signal of a second state, applied to each of the data select circuits, allows the plurality of sequential circuits to operate normally.

10. The integrated circuit of claim 9, wherein the select signal of a first state, applied to the single clock switch circuit, selects the scan clock signal for application to the plurality of sequential circuits, and the select signal of a second state, applied to the single clock switch circuit, selects the system clock signal for application to the plurality of sequential circuits.

11. The integrated circuit of claim 10, wherein a select signal of the same state controls each of the data select circuits and the single clock switch circuit.

12. The integrated circuit of claim 9, wherein the scan clock signal is applied only to the sequential circuits connected in the form of the shift register to set or read out the internal memory state of each of the sequential circuits.

13. An integrated circuit in accordance with claim 5, wherein each of said data select circuits comprises a switch.

14. An integrated circuit in accordance with claim 5, wherein each of said data select circuits comprises first and second latch circuits, first and second switches and an inverter.

15. The integrated circuit of claim 5, wherein the scan clock signal is applied only to the sequential circuits connected in the form of the shift register to set or read out the internal memory state of each of the sequential circuits.

16. An integrated circuit controlled by a plurality of clock signal systems, comprising:
    a plurality of combinational circuits;
    a plurality of sequential circuits, each connected to at least one combinational circuit, the plurality of sequential circuits including,
    a plurality of data select circuits for connecting at least two of the plurality of sequential circuits in the form of shift registers, each of said data select circuits corresponding to one of said sequential circuits and only the clock signal systems which include sequential circuits connected in the form of shift registers are combined into common clock signal systems; and
    a single clock switch circuit, connected to each of the sequential circuits, being provided for each common clock signal system, for selecting between a system clock signal and a scan clock signal, said scan clock signal being applied to at least two of the plurality of sequential circuits only when said plurality of data select circuits connect said at least two of the plurality of sequential circuits in the form of a shift register in each common clock system.

17. A method of testing an integrated circuit having combinational circuits and sequential circuits, each including scan circuits, comprising the steps of:
    (a) connecting at least two of the sequential circuits in the form of a shift register through the corresponding scan circuits upon receipt of an external signal of a first state;
    (b) applying a scan clock signal, through a common single clock switching circuit, to only the sequential circuits connected in the form of said shift register to set or read out the internal memory state of each of the sequential circuits, wherein only the clock signal systems connected in the form of said shift register are combinable into one or more common clock signal systems; and
    (c) switching a signal to be applied to each of the common clock signal systems between a system clock signal and scan clock signal by the single clock switching circuit provided for each of the common clock signal systems.

18. The integrated circuit of claim 17, wherein the scan clock signal is applied only to the sequential circuits connected in the form of the shift register to set or read out the internal memory state of each of the sequential circuits.

19. The integrated circuit of claim 17, wherein a select signal controls each of the data select circuits and the single clock switch circuit.

20. The integrated circuit of claim 19, wherein a select signal of a first state, applied to each of the data select circuits, connects at least two of the plurality of sequential circuits in the form of a shift register and a select signal of a second state, applied to each of the data select circuits, allows the plurality of sequential circuits to operate normally.

21. The integrated circuit of claim 20, wherein the select signal of a first state, applied to the single clock switch circuit, selects the scan clock signal for application to the plurality of sequential circuits, and the select signal of a second state, applied to the single clock switch circuit, selects the system clock signal for application to the plurality of sequential circuits.

22. The integrated circuit of claim 21, wherein a select signal of the same state controls each of the data select circuits and the single clock switch circuit.

23. The integrated circuit of claim 20, wherein the scan clock signal is applied only to the sequential circuits connected in the form of the shift register to set or read out the internal memory state of each of the sequential circuits.

* * * * *